US011314279B2

(12) United States Patent
Hong et al.

(10) Patent No.: US 11,314,279 B2
(45) Date of Patent: Apr. 26, 2022

(54) DISPLAY PANEL, HOLE FORMING METHOD, AND ELECTRONIC EQUIPMENT

(71) Applicant: BOE Technology Group Co., Ltd., Beijing (CN)

(72) Inventors: Rui Hong, Beijing (CN); Song Zhang, Beijing (CN); Chengjie Qin, Beijing (CN); Tao Wang, Beijing (CN); Lingzhi Qian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/935,750

(22) Filed: Jul. 22, 2020

(65) Prior Publication Data
US 2021/0026404 A1    Jan. 28, 2021

(30) Foreign Application Priority Data
Jul. 22, 2019   (CN) .......................... 201910664164.7

(51) Int. Cl.
| | |
|---|---|
| *G06F 1/16* | (2006.01) |
| *H01L 27/32* | (2006.01) |
| *H01L 51/00* | (2006.01) |
| *H01L 51/52* | (2006.01) |
| *H01L 51/56* | (2006.01) |

(52) U.S. Cl.
CPC .......... *G06F 1/1605* (2013.01); *G06F 1/1686* (2013.01); *H01L 27/3234* (2013.01); *H01L 51/0027* (2013.01); *H01L 51/5253* (2013.01); *H01L 51/56* (2013.01)

(58) Field of Classification Search
CPC ............................. G06F 1/1686; H01L 27/32
See application file for complete search history.

(56) References Cited

U.S. PATENT DOCUMENTS

| | | | | |
|---|---|---|---|---|
| 10,700,305 | B2 * | 6/2020 | Wang | H01L 51/5246 |
| 10,784,473 | B2 * | 9/2020 | Ye | H01L 27/3227 |
| 10,847,589 | B2 * | 11/2020 | Xiang | H01L 27/3246 |
| 10,978,526 | B2 * | 4/2021 | Qin | H01L 51/5253 |
| 2002/0145380 | A1 | 10/2002 | Aziz et al. | |
| 2012/0091877 | A1 | 4/2012 | Verschuren | |
| 2019/0074345 | A1 | 3/2019 | Lee et al. | |
| 2020/0052244 | A1 | 2/2020 | Gu et al. | |
| 2020/0185466 | A1 | 6/2020 | Xiang | |

(Continued)

FOREIGN PATENT DOCUMENTS

| | | |
|---|---|---|
| CN | 102379047 A | 3/2012 |
| CN | 106328680 A | 1/2017 |
| CN | 108417733 A | 8/2018 |

(Continued)

OTHER PUBLICATIONS

Office Action dated Mar. 23, 2021, issued in counterpart CN Application No. 201910664164.7, with English Translation. (15 pages).

*Primary Examiner* — Adrian S Wilson
(74) *Attorney, Agent, or Firm* — WHDA, LLP

(57) ABSTRACT

A display panel is provided which comprises a substrate, a backboard, and an electroluminescent device layer, which are stacked in sequence, the electroluminescent device layer having a hole at a display region of the display panel, a laser protection layer is provided on a periphery of the hole of the electroluminescent device layer.

12 Claims, 3 Drawing Sheets

(56) References Cited

U.S. PATENT DOCUMENTS

2020/0212370 A1    7/2020  Ye
2021/0135160 A1*   5/2021  Sun ..................... H01L 27/3234

FOREIGN PATENT DOCUMENTS

| CN | 108766318 A | 11/2018 |
| CN | 208093561 U | 11/2018 |
| CN | 109065759 A | 12/2018 |
| CN | 109148525 A | 1/2019 |
| CN | 109671858 A | 4/2019 |
| CN | 109873015 A | 6/2019 |
| CN | 109904346 A | 6/2019 |
| CN | 110010665 A | 7/2019 |

* cited by examiner

DISPLAY PANEL, HOLE FORMING METHOD, AND ELECTRONIC EQUIPMENT

CROSS-REFERENCE TO RELATED APPLICATION

This application claims priority of Chinese Patent Application No. 201910664164.7 filed on Jul. 22, 2019 in China National Intellectual Property Administration, the disclosure of which is incorporated herein by reference in entirety.

TECHNICAL FIELD

The present disclosure relates to the field of display technology, and in particular, to a display panel, a hole forming method and an electronic equipment.

BACKGROUND

In some electronic equipment such as mobile phone products, the design of the camera in the light-emitting area of the mobile phone screen is a new consumer demand. In order to form such product, it is necessary to form a hole in the light-emitting area in order to install the camera in the subsequent module process. The existing method is to cut off a part of the OLED device structure with a laser at a place where the hole is needed.

SUMMARY

According to an aspect of the present disclosure, there is provided a display panel comprising a substrate, a backboard, and an electroluminescent device layer, which are stacked in sequence, the electroluminescent device layer having a hole at a display region of the display panel, wherein:

a laser protection layer is provided on a periphery of the hole of the electroluminescent device layer.

In some embodiments, the electroluminescent device layer comprises a metal cathode layer, and the laser protection layer is provided on the periphery of the hole of the metal cathode layer.

In some embodiments, an orthographic projection of a hole edge of the hole of the metal cathode layer onto the substrate and an orthographic projection of an inner side edge of the laser protection layer at the hole onto the substrate coincide.

In some embodiments, the laser protection layer is in a shape of a closed loop, wherein an orthographic projection of an inner side edge of the closed loop onto the substrate and an orthographic projection of the hole onto the substrate coincide.

In some embodiments, the laser protection layer is a closed loop in a shape of a circular, a rectangle or a rhombus.

In some embodiments, the laser protection layer has a thickness of 2-10 microns.

In some embodiments, the closed loop has a width of 0.5-2 mm.

In some embodiments, the hole is a through hole penetrating the display panel.

In some embodiments, an encapsulation layer is further provided on the electroluminescent device layer, and the encapsulation layer covers the laser protection layer, and covers the periphery and the inner side edge of the hole.

According to another aspect of the present disclosure, there is provided a hole forming method for a display panel, wherein the display panel comprises a substrate, a backboard, and an electroluminescent device layer, wherein the hole forming method comprises:

forming, by adopting a glass encapsulation material, a laser protection layer on the electroluminescent device layer, wherein the laser protection layer has a hole;

cutting, by using a laser, the electroluminescent device layer along an hole edge of the hole of the laser protection layer to form a hole in the electroluminescent device layer.

In some embodiments, the step of cutting, by using the laser, the electroluminescent device layer and layers below the electroluminescent device layer along the hole edge of the hole of the laser protection layer to form the hole penetrating the display panel.

In some embodiments, the step of forming, by adopting a glass encapsulation material, a laser protection layer on the electroluminescent device layer, comprises:

curing the glass encapsulation material by heating at a heating temperature of 80°-120° and a heating time of 5-30 minutes.

In some embodiments, the step of forming, by adopting a glass encapsulation material, a laser protection layer on the electroluminescent device layer, comprises:

forming a laser protection layer with the shape of a closed loop.

In some embodiments, after the step of forming a hole, the method further comprises:

forming an encapsulation layer on the electroluminescent device layer, so that the encapsulation layer covers the laser protection layer and covers the periphery and the inner side of the hole.

According another aspect of the present disclosure, there is provided an electronic equipment, comprising the display panel mentioned above.

In some embodiments, a camera device is provided at the hole of the display panel.

BRIEF DESCRIPTION OF THE DRAWINGS

Other features, objects, and advantages of the present disclosure will become more apparent by reading the detailed description of the non-limiting embodiments made with reference to the following drawings, in which.

DETAILED DESCRIPTION OF EMBODIMENTS

Figure 1:
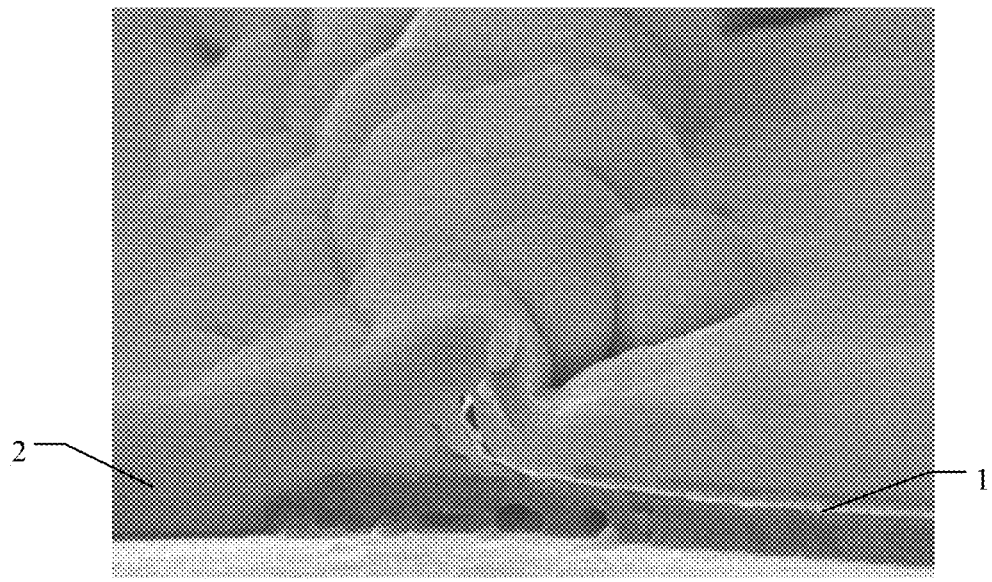
FIG. 1 shows an exemplary schematic diagram of a package failure of an existing display panel.

The present disclosure will be further described in detail below with reference to the drawings and embodiments. It can be understood that the specific embodiments described herein are only used to explain the related invention, but not to limit the invention. It should also be noted that, for ease of description, only the parts related to the invention are shown in the drawings.

Unless otherwise defined, the technical terms or scientific terms used in the present disclosure shall have their ordinary meanings as understood by those of ordinary skill in the art. The terms "first", "second" and similar words used in the present disclosure do not indicate any order, quantity or importance, but are only used to distinguish different components. The term "comprise" or "include" or similar words means that the elements or objects appearing before the word cover the elements or objects listed after the word and their equivalents, but do not exclude other elements or objects. The term "connect" or "communicate" or similar words is not limited to physical or mechanical connections, but may include electrical connections, whether direct or indirect. "Up", "down", "left", "right", etc. are only used to indicate the relative positional relationship. The relative positional relationship may change accordingly when the absolute position of the described object changes.

It should be noted that the embodiments in the present disclosure and the features in the embodiments can be combined with each other without conflict. The present disclosure will be described in detail below with reference to the drawings and in conjunction with the embodiments.

As shown in FIG. 1, the existing method is to cut a part of the OLED device structure with a laser at a place where the hole is needed. The metal cathode 1 will form a circle of metal warpages or metal residues at the hole due to the laser cutting effect. In the subsequent encapsulation process using vapor deposition, the film of the encapsulation layer will grow along the metal warpages and residues. Due to the limited coverage of the inorganic encapsulation layer, these metal warpages and residues can cause encapsulation failure and affect the life of the product.

In order to solve the above problems, the present disclosure provides a technical solution that can effectively improve the packaging effect of a display panel with a hole.

Figure 2:
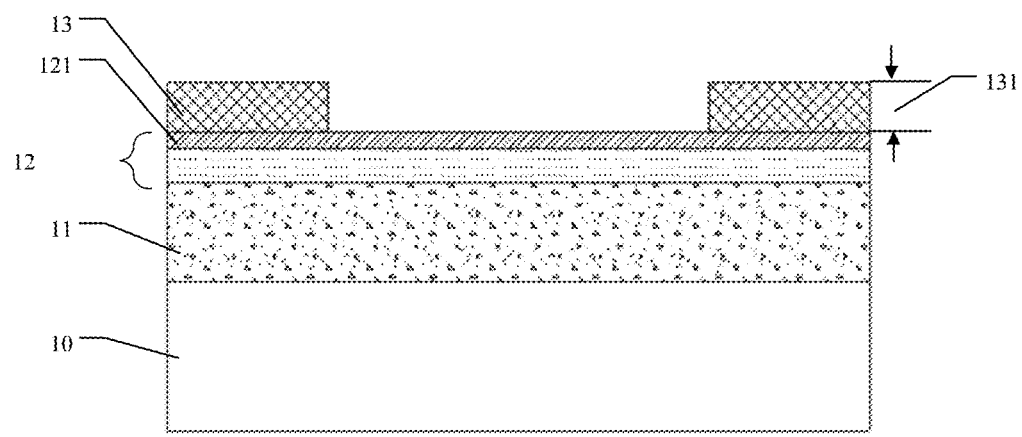
FIG. 2 shows an exemplary layer structure diagram of a display panel according to an embodiment of the present disclosure.
Figure 3:
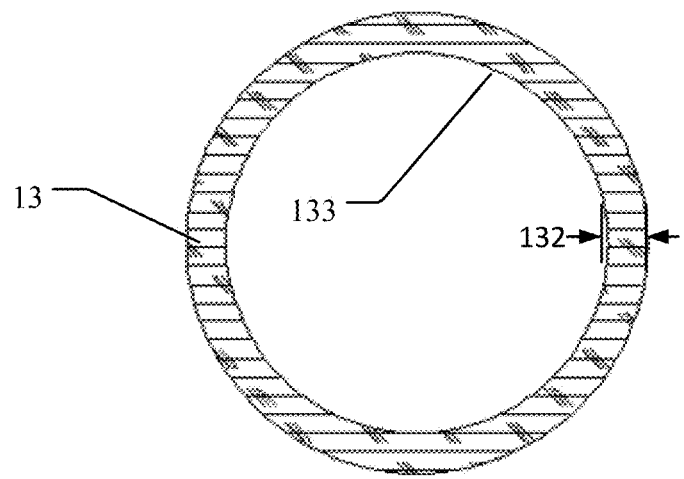
FIG. 3 shows an exemplary top view of the laser protection layer of FIG. 2.
Figure 4:
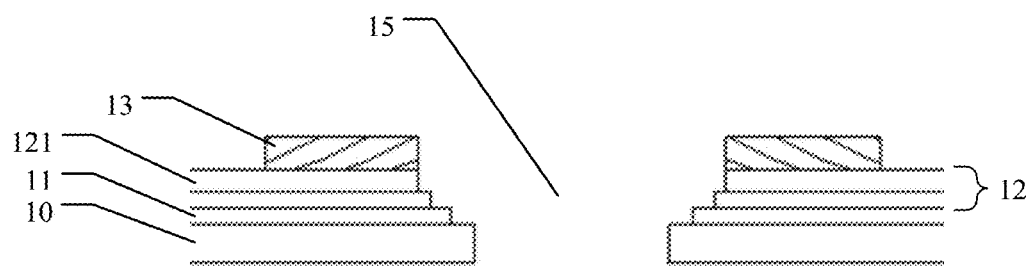
FIG. 4 shows an exemplary layer structure diagram of the display panel according to an embodiment of the present disclosure after forming a hole.

As shown in FIG. 2, FIG. 3 and FIG. 4, a display panel comprises a substrate 10, a backboard 11, and an electroluminescent device layer 12, which are stacked in sequence, the electroluminescent device layer 12 has a hole at a display region of the display panel. The display panel further comprises: a laser protection layer 13 provided on a periphery of the hole 15 of the electroluminescent device layer.

The electroluminescent device layer includes a metal cathode layer 121, and the laser protection layer 13 is provided on the periphery of the hole of the metal cathode layer 121.

In a package of the display panel with the hole, the reason for affecting the packaging effect is the warpages of the metal around the hole, so preventing the metal warpages during the hole forming process will effectively improve the packaging effect. Specifically, provision of the laser protection layer 13 tightly adjacent to the metal cathode layer 121 on the electroluminescent device layer of the display panel can effectively suppress the warpages of the metal cathode layer in the light emitting device, thereby improving the sealing effect of the encapsulation layer.

Further, an orthographic projection of a hole edge of the hole of the metal cathode layer onto the substrate and an orthographic projection of an inner side edge of the laser protection layer at the hole onto the substrate coincide, as shown in FIG. 4. The benefit of this structure is that the laser protection layer 13 can effectively suppress the warpages of the metal cathode layer 121 during cutting.

Further, the laser protection layer 13 is in a shape of a closed loop, wherein an orthographic projection of an inner side edge of the closed loop onto the substrate and an orthographic projection of the hole onto the substrate coincide.

Further, the laser protection layer is a closed loop in a shape of a circular, a rectangle or a rhombus.

In practical applications, depending on the shape of the hole, the shape of the laser protection layer can be a closed loop in a shape of a circular, a rectangle or a rhombus. When the hole is circular, a circular loop is used; when the hole is rectangular, a rectangular loop is used; when the hole is in a rhombic shape, a rhombic loop is used. It should be noted that the shape of the laser protection layer in practical applications is not limited here, and any geometric shape can be used.

Further, the laser protection layer 131 has a thickness of 2-10 microns and a width of 0.5-2 mm.

Further, the hole is a through hole penetrating the display panel.

Further, an encapsulation layer is further provided on the electroluminescent device layer, and the encapsulation layer covers the laser protection layer, and covers the periphery and the inner side edge of the hole.

In order to ensure that the laser protection layer can effectively suppress the warpages of the metal layer when a laser is used to form the hole, the thickness and width of the laser protection layer can be in the following ranges: the thickness is of 2-10 microns, and the width is of 0.5-2 mm.

Herein, the thickness and width of the laser protection layer can be set according to the thickness of the metal layer. If the thickness is too small, it will not effectively prevent the metal layer from warping; and if the thickness is too large, it will affect the thickness of the display panel. If the width is too small, the area where the metal layer may wrap cannot be effectively covered; and if the width is too large, space is wasted and the area of the display region is reduced.

Figure 6:
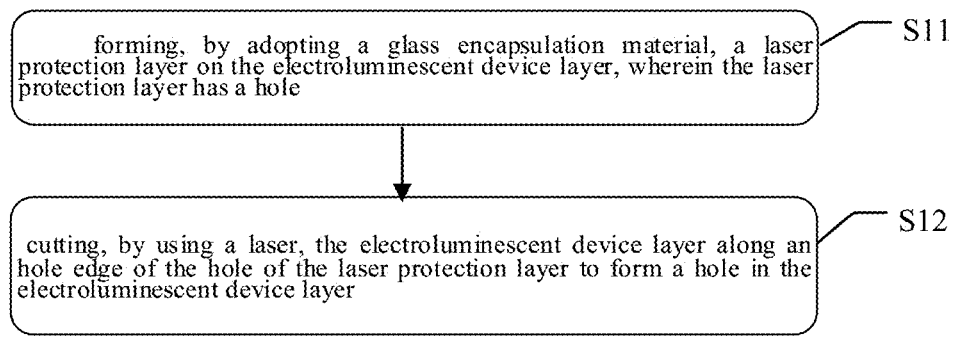
FIG. 6 shows an exemplary flowchart of a hole forming method for a display panel according to an embodiment of the present disclosure.

As shown in FIG. 6, the present disclosure also provides a hole forming method for a display panel. The display panel includes a substrate, a backboard, and an electroluminescent device layer. The hole forming method includes:

step S11 of forming, by adopting a glass encapsulation material, a laser protection layer on the electroluminescent device layer, wherein the laser protection layer has a hole; and step S12 of cutting, by using a laser, the electroluminescent device layer along an inner side edge of the hole of the laser protection layer to form a hole in the electroluminescent device layer.

Further, the laser is used to cut off the electroluminescent device layer and the layers below the electroluminescent device layer along the inner side edge of the laser protection layer to form the hole penetrating the display panel.

As shown in FIG. 2, in the manufacturing process of the display panel, after forming the substrate, the backboard, and the electroluminescent device, a glass encapsulation material (frit material which is usually composed of glass powder, oxide, filler and binder) is used on the electroluminescent device layer to form the laser protection layer.

Specifically, the laser protection layer 13 shown in FIG. 2 is formed by using a glass encapsulation paste by means of screen printing or dispensing. The glass encapsulation paste is cured by heating at the heating temperature of 80°-120°, and the heating time of 5-30 minutes. The purpose of curing by heating is to remove the organic components in the slurry and obtain a certain mechanical strength. After curing by heating at the same time, the combination of glass encapsulation material and metal cathode layer is tighter.

Further, the forming, by adopting a glass encapsulation material, a laser protection layer on the electroluminescent device layer, comprises: forming a laser protection layer with the shape of a closed loop.

Further, the encapsulation layer covers the laser protection layer and covers the periphery and the inner side edge of the hole.

As shown in FIGS. 3 and 4, the laser cuts off the electroluminescent device layer along the inner side edge 133 of the laser protection layer 13 and the layers below the electroluminescent device layer to form the hole 15 inside the laser protection layer. The metal layer after cutting will not be wrapped because the upper layer covers the laser protection layer with a certain mechanical strength that is tightly attached to it. It should be noted that FIG. 4 only shows an example of the hole edge. In this figure a stepped hole edge structure is shown. Here, the structure of the hole edge is not limited.

Figure 5:
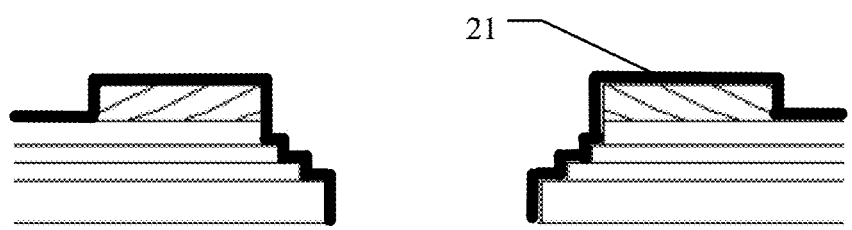
FIG. 5 shows an exemplary layer structure diagram of a display panel according to an embodiment of the present disclosure after forming a hole, in which an encapsulation layer is included.

As shown in FIG. 5, after the hole is cut out, an encapsulation layer 21 is formed on the electroluminescent device layer using Plasma Enhanced Chemical Vapor Deposition (PECVD) method, and the encapsulation layer 21 covers the hole. At this time, since the metal layer is not warped, the sealing property of the encapsulation layer 21 is ensured.

Figure 7:
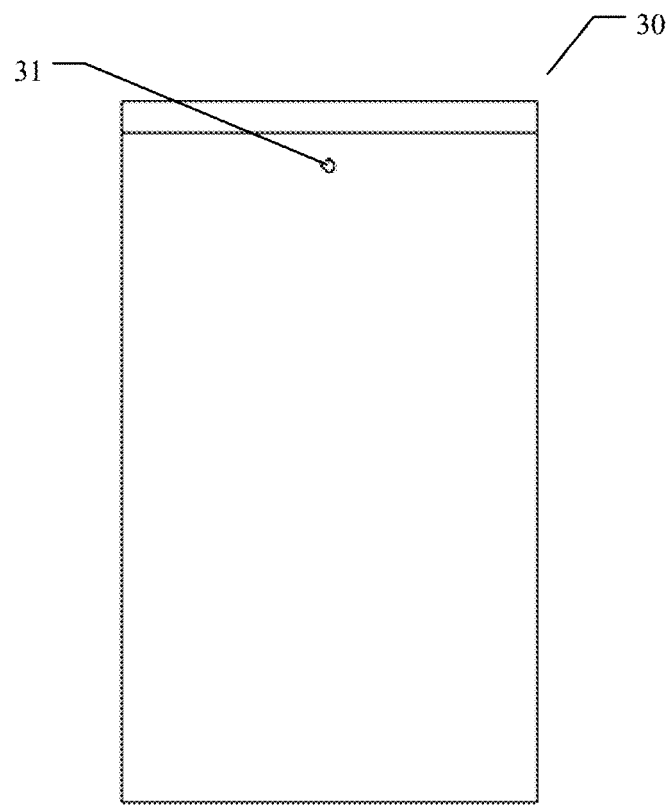
FIG. 7 shows an exemplary schematic diagram of an electronic equipment according to an embodiment of the present disclosure.

As shown in FIG. 7, the present disclosure also provides an electronic equipment 30 including the display panel provided by the embodiments of the present disclosure.

Further, a camera device 31 is provided at the opening of the display panel. The electronic equipment may be a mobile phone, a tablet computer, a desktop computer, a notebook computer, etc.

The above description is only the preferred embodiments of the present disclosure and the explanation of the applied technical principles. It should be understood by those skilled in the art that the scope of the invention involved in this disclosure is not limited to a technical solution formed by a specific combination of the above technical features, but should also cover other technical solutions formed by any combination of the above technical features or their equivalent features without departing from the inventive concept. For example, a technical solution is formed by replacing the above features and the technical features of the present disclosure (but not limited to) with similar functions with each other.

What is claimed is:

1. A hole forming method for a display panel, wherein the display panel comprises a substrate, a backboard, and an electroluminescent device layer, wherein the hole forming method comprises:
   forming, by adopting a glass encapsulation material, a laser protection layer on the electroluminescent device layer, wherein the laser protection layer has a hole;
   cutting, by using a laser, the electroluminescent device layer along a hole edge of the hole of the laser protection layer to form a hole in the electroluminescent device layer;
   wherein forming, by adopting the glass encapsulation material, the laser protection layer on the electroluminescent device layer comprises:
   curing the glass encapsulation material by heating at a heating temperature of 80°-120° and a heating time of 5-30 minutes.

2. The hole forming method of claim 1, wherein cutting, by using the laser, the electroluminescent device layer and layers below the electroluminescent device layer along the hole edge of the hole of the laser protection layer to form the hole penetrating the display panel.

3. The hole forming method of claim 1, wherein the forming, by adopting a glass encapsulation material, a laser protection layer on the electroluminescent device layer, comprises:
   forming a laser protection layer with the shape of a closed loop.

4. The hole forming method of claim 1, after the step of forming a hole, comprising:
   forming an encapsulation layer on the electroluminescent device layer, so that the encapsulation layer covers the laser protection layer and covers the periphery and the inner side of the hole.

5. An electronic equipment, comprising a display panel manufactured by a hole forming method,
   wherein the display panel comprises a substrate, a backboard, and an electroluminescent device layer; and
   the hole forming method comprises:
   forming, by adopting a glass encapsulation material, a laser protection layer on the electroluminescent device layer, wherein the laser protection layer has a hole;
   cutting, by using a laser, the electroluminescent device layer along a hole edge of the hole of the laser protection layer to form a hole in the electroluminescent device layer;
   wherein forming, by adopting the glass encapsulation material, the laser protection layer on the electroluminescent device layer comprises:
   curing the glass encapsulation material by heating at a heating temperature of 80°-120° and a heating time of 5-30 minutes.

6. The electronic equipment of claim 5, wherein a camera device is provided at the hole of the display panel.

7. The method of claim 1, wherein the electroluminescent device layer comprises a metal cathode layer, and the laser protection layer is provided on the periphery of the hole of the metal cathode layer.

8. The method of claim 7, wherein an orthographic projection of a hole edge of the hole of the metal cathode layer onto the substrate and an orthographic projection of an inner side edge of the laser protection layer at the hole onto the substrate coincide.

9. The method of claim 3, wherein an orthographic projection of an inner side edge of the closed loop onto the substrate and an orthographic projection of the hole onto the substrate coincide.

10. The method of claim 9, wherein the laser protection layer is a closed loop in a shape of a circular, a rectangle or a rhombus.

11. The method of claim 1, wherein the laser protection layer has a thickness of 2-10 microns.

12. The method of claim 9, wherein the closed loop has a width of 0.5-2 mm.

* * * * *